United States Patent
West et al.

(10) Patent No.: US 7,222,280 B1
(45) Date of Patent: May 22, 2007

(54) DIAGNOSTIC PROCESS FOR AUTOMATED TEST EQUIPMENT

(75) Inventors: Burnell G. West, Half Moon Bay, CA (US); Rodolfo E. Garcia, San Jose, CA (US)

(73) Assignee: Credence Systems Corporation, Milpitas, CA (US)

( * ) Notice: Subject to any disclaimer, the term of this patent is extended or adjusted under 35 U.S.C. 154(b) by 294 days.

(21) Appl. No.: 10/825,409

(22) Filed: Apr. 14, 2004

Related U.S. Application Data

(60) Provisional application No. 60/463,166, filed on Apr. 15, 2003.

(51) Int. Cl.
*G01R 31/28* (2006.01)

(52) U.S. Cl. ..................................................... 714/736

(58) Field of Classification Search ................ 714/733, 714/736, 738
See application file for complete search history.

(56) References Cited

U.S. PATENT DOCUMENTS

| 5,646,948 A | * | 7/1997 | Kobayashi et al. | ......... 714/719 |
| 6,950,974 B1 | * | 9/2005 | Wohl et al. | ................. 714/733 |

* cited by examiner

*Primary Examiner*—James C. Kerveros

(57) ABSTRACT

A test apparatus including a means for sending a first test pattern to a device under test (DUT), where the first test pattern is a part of a planned sequence of tests, and further including a means for evaluating the test results received from the DUT, and a method of testing are described. The test results may include anomalous data indicative of a defect in the DUT. If so, a second test pattern that is not part of the planned sequence of tests is selected. The second test pattern is selected based on a diagnosis of the anomalous data by the test apparatus.

20 Claims, 17 Drawing Sheets

DIAGNOSTIC PROCESS FOR AUTOMATED TEST EQUIPMENT

RELATED UNITED STATES PATENT APPLICATIONS

This application claims priority to the copending provisional patent application Ser. No. 60/463,166, entitled "Tester with Diagnostic Capability," with filing date Apr. 15, 2003, hereby incorporated by reference in its entirety.

This application is related to U.S. patent application Ser. No. 10/824,703 by B. West et al., filed on Apr. 14, 2004, entitled "Configurable Tester with Diagnostic Capability," assigned to the assignee of the present invention, and hereby incorporated by reference in its entirety.

TECHNICAL FIELD

Embodiments of the present invention pertain to automated test equipment (ATE).

BACKGROUND ART

Automated test equipment (ATE) conventionally execute tests on devices such as integrated circuits according to a stored program. In order to diagnose a failure in a device under test (DUT), a number of related stored programs are executed and the results of each of these tests is evaluated. If there is a test program failure in the DUT, the use of multiple tests can narrow down where in the DUT the failure occurred, thereby facilitating further analysis to determine whether a defect is causing the test program failure, and if so what the defect might be.

To aid in the testing process, technologies such as built-in self-test (BIST) can be incorporated into the DUT. As a major portion of the role of ATE migrates from functional testing to structural testing, whereby an action or sequence of actions is taken to place the DUT into a state that enables a particular test, followed by an action or sequence of actions to execute the test, followed by an action or sequence of actions to record the results of the test, and as BISTs become more sophisticated, the relationship between the ATE and the DUT becomes more abstract. That is to say, the ATE simply instructs the BIST to apply a particular test pattern or vector and to report the results. The data developed inside the DUT as a result of executing the test is then scanned out as a bit stream to the ATE. A test program failure, indicating the possibility of a defect in the DUT, is indicated if that data is not what was expected. Adding to the complexity is the fact that there is not a single, standardized way in which data generated by the BIST is communicated to the ATE. Chip designers may use one of several protocols to communicate the data generated by the BIST to the ATE, depending on other design constraints that may need to be considered.

As devices become more complicated, it becomes more difficult to identify where in the DUT is the defect that caused a test program failure. For example, the time at which the defect caused the failure may be separated from the time in which the failure is evidenced in the bit stream. Despite the fact that a relatively large amount of data is being collected, it remains difficult to isolate and pin down the defect.

To summarize, according to the prior art, a planned sequence of tests is applied to a DUT, and the results of those tests are logged and evaluated. If the test results are anomalous, indicating a potential defect in the DUT, further actions can be taken to verify and pinpoint the defect.

The prior art approaches for testing devices are problematic because of the amount of time needed to conduct the sequence of tests and to collect and evaluate the test results before the next step can be taken to pinpoint the cause of a test program failure. A method and/or system that can reduce the length of time needed would be advantageous. The present invention provides a novel solution to this problem and related problems.

SUMMARY OF THE INVENTION

Embodiments of the invention pertain to a test apparatus and method of testing. A first test pattern is sent to a device under test (DUT). The first test pattern part of a planned sequence of tests. Test results received from the DUT are evaluated. The test results may include anomalous data indicative of a defect in the DUT. If so, a second test pattern that is not part of the planned sequence of tests is selected. The second test pattern is selected based on a diagnosis of the anomalous data by the test apparatus.

Thus, according to embodiments of the invention, the test apparatus recognizes that there may be a defect in the DUT and changes the test flow before the entire sequence of planned tests is applied to the DUT, thus saving time.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures and components have not been described in detail as not to unnecessarily obscure aspects of the present invention.

Some portions of the detailed descriptions, which follow, are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "communicating" or "receiving" or "sending" or "storing" or "configuring" or "allocating" or "capturing" or "selecting" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Figure 1:
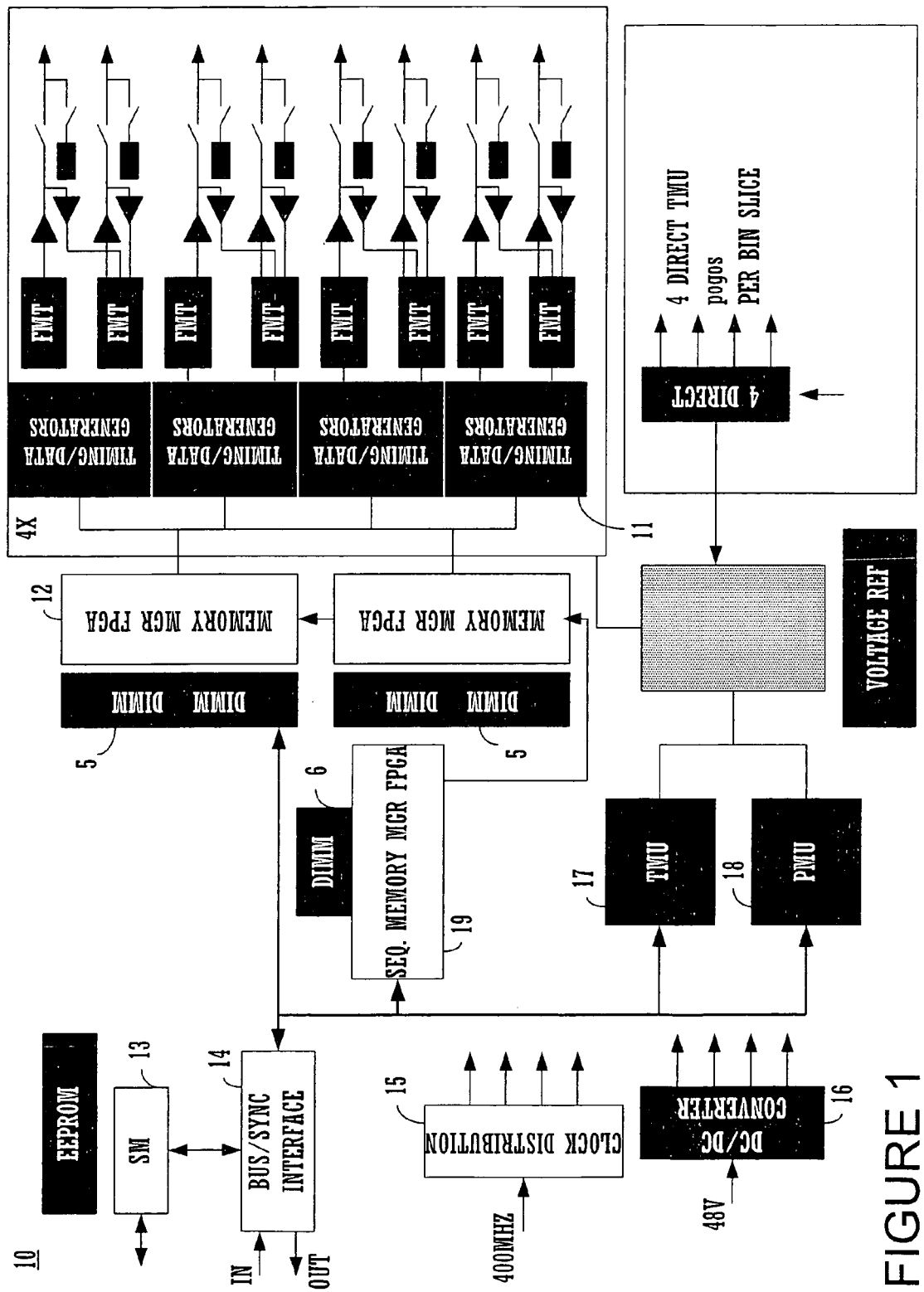
FIG. 1 is a block diagram of one embodiment of a digital test instrument in accordance with the present invention.

FIG. 1 is a block diagram of one embodiment of a digital test instrument 10 in accordance with the present invention. In the present embodiment, test instrument 10 includes a system monitor 13 coupled to bus/sync interface 14. A clock signal is distributed via clock distribution block 15 to various other blocks in test instrument 10. Power is supplied via DC/DC converter block 16.

Timing measure unit (TMU) 17 is for measuring timing parameters of a device under test (DUT), and parametric (or precision) measurement unit (PMU) 18 is for DC parametric measurements. In the present embodiment, there are four additional dedicated channels that have access to the TMU 17. These channels are buffered with their own comparators and have pull-up/pull-down terminations and digital-to-analog converters (DACs). These channels can be used for testing ring oscillator structures that may be on-chip or on wafer kerfs.

The timing/format generators 11 are per pin functions, and are connected to per pin drivers, comparators, loads and the PMU 18. Per pin DACs can be used to establish required drive/compare levels.

In the present embodiment, test instrument 10 includes a sequencing memory manager 19 and a data memory manager 12. In one embodiment, the sequencing memory manager 19 and the data memory manager 12 are field-programmable gate arrays (FPGAs). The sequencing memory manager 19 and data memory manager 12 FPGAs control test vector patterns, test vector sequences, and the capture memories (e.g., the dual in-line memory modules, DIMMs 5 and 6).

Significantly, the test vector patterns, test vector sequences, and capture memories are not per pin. Instead, test instrument 10 implements a "sea of memory" in which memory resources (e.g., DIMMs 5 and 6) are pooled and allocated under program control. Accordingly, each pin consumes only the memory it needs. If multiple pins are designated as scan pins, then they can utilize more of the memory pool to hold the scan vectors. Also, there need not be an equal number of scan-in pins and scan-out pins, providing the flexibility to support a variety of scan compression techniques.

Furthermore, the memory resident in the DIMMs that is under control of the data memory manager FPGA 12 is not used just to store test vector information, but can also be used to capture DUT data. This capability enables the capture of large amounts of DUT output data, such as digitized analog test applications or results produced by built-in self test (BIST) structures (e.g., engines) on the DUT (on-chip BIST engines).

Also, as will be seen, test instrument 10 is configurable (programmable) according to the different protocols employed by different BIST engines and design-for-testing (DFT) techniques. This capability allows test instrument 10 to determine when there is valid data to capture from on-chip BIST engines.

In addition, test instrument 10 can have its own period generator and vector sequencer, allowing it to operate in its own time domain to facilitate testing of devices with input/outputs (I/Os) that operate in multiple time domains, and/or for concurrent test applications.

Figure 2:
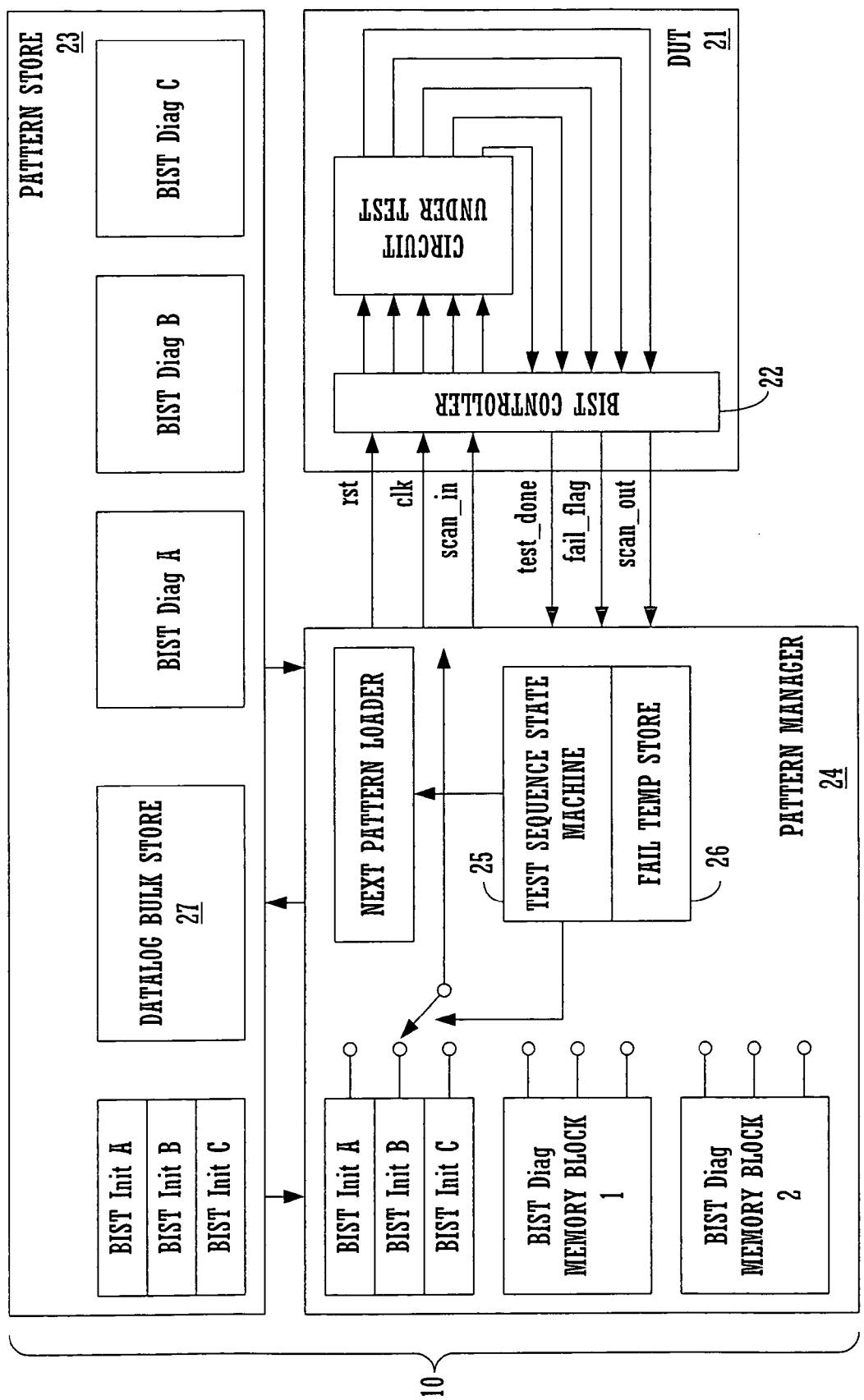
FIG. 2 is a block diagram illustrating the flow of test data and results between a test instrument and a device under test (DUT) in accordance with one embodiment of the present invention.

FIG. 2 is a block diagram illustrating the flow of test data and results between a test instrument 10 and a DUT 21 in accordance with one embodiment of the present invention. Pattern store 23 and pattern manager 24 are resident on the test instrument 10. Referring also to FIG. 1, pattern store 23 generally corresponds to DIMMs 5, and pattern manager 24 generally corresponds to the sequencing memory manager 19, acting in concert with the data memory manager 12.

DUT 21 of FIG. 2 includes a BIST engine or BIST controller 22. There are, in general, two parts to a BIST session. The first part is setting up the BIST controller 22 to execute a specific mode of testing. The second part involves the capture of data produced during execution of the test. The second part is described further below, beginning at FIG. 3. The configuration of the pattern manager 24 to support initialization of the BIST controller 22 is first described.

Referring to FIG. 2, a sequence of BIST initialization test vector sets for test A (BIST Init A) is loaded into pattern manager 24, and the diagnostic pattern set (or suite) for test A (BIST Diag A) is also loaded into BIST Diag Memory Block 1. At the time the test is started, BIST Init A is scanned into BIST controller 22. After a number of clock cycles that is typically determined according to BIST Init A and the BIST controller 22, either a "test done" flag (when the test is successful) or a "fail flag" (when a test program failure occurs) will be raised. During execution of BIST Init A, the diagnosis pattern for test B (BIST Diag B) is loaded into BIST Diag Memory Block 2 by the test sequence state machine 25.

If the test done flag is set (e.g., true) and there is not a fail flag, then BIST Init B is scanned into the BIST controller 22, and at the same time the test sequence state machine 25 starts loading the diagnostic pattern for test C (BIST Diag C) into BIST Diag Memory Block 1. Thus, when there is not a fail flag, the planned test sequence includes test A, then test B, then test C, and so on (if there are other tests planned). However, if the fail flag is set (e.g., true), the failing sequence of data (e.g., anomalous data) is scanned into the fail temporary store block 26.

If test instrument 10 is in production mode, then the failing sequence of data is queued up to be offloaded to the datalog bulk store block 27.

If test instrument 10 is in diagnostic mode, then the test pattern to be scanned into the BIST controller 22 is not BIST Init B, but is instead a test pattern selected from BIST Diag A currently loaded into BIST Diag Memory Block 1. Additional tests can be similarly selected from the BIST Diag A set, or perhaps from another diagnostic pattern suite.

In one embodiment, the test pattern selected from BIST Diag A is selected by diagnosing the failing sequence of data. For example, the test pattern selected from the BIST Diag A set can be selected based on the pattern of bits in the failing sequence of data. Other information can be used to select a diagnostic test pattern. For example, the failing pin(s) and the test cycle count can be datalogged. The failing pin can be used identify the scan out path. The test cycle count can be used to identify the failing flop using a precomputed correlation between test count and the start of each scan pattern (for each scan chain). Any of this information can be considered in the selection of a diagnostic test pattern in order to collect multiple failing scan vectors that may help point to an area of failure in the DUT.

Thus, according to embodiments of the present invention, with test instrument 10 in diagnostic mode, the test sequence is changed from the planned sequence to a different test or sequence of tests (e.g., a sequence of diagnostic tests). The sequence of diagnostic tests is intelligently selected based on test results. Importantly, the entire planned test sequence is not necessarily completed before the diagnostic tests are introduced, thus saving time.

The DUT can be kept activated and synchronized with the test system while the determination is made about which diagnostic test pattern to select, if the time needed to make that determination becomes significant. After completion of the diagnostic tests, the test process can return to the planned test sequence if that would prove useful. Additional discussion of the overall test process is provided in conjunction with FIGS. 16 and 17, below.

In the present embodiment, the test instrument 10 of FIG. 2 only receives anomalous data or data that appears to be anomalous. In general, a chip designer, in the process of creating a chip, imposes a protocol to be used to convey BIST results to the I/O pins. Described below are different protocols that can be used to collect (capture) data. Importantly, test instrument 10 can be configured according to the protocol that is to be used. Generally speaking, test instrument 10 can be configured according to the type of information that is to be received from the DUT.

There can be at least two general approaches to configuring a test apparatus according to the type of protocol that may be used. In one approach, a test apparatus is programmably configured for the protocol in use. That is, the test apparatus is changed from one state (corresponding to one protocol) to another (corresponding to a different protocol) by virtue of its programmability. In a second approach, the test apparatus can be "hardwired" with the logic for each of a number of different protocols. The logic for the protocol in use can then be selected and applied. In general, although the embodiments above describe a programmable implementation, the invention is not so limited, and configuration of the test device can be accomplished in software, hardware, firmware or a combination thereof.

The processes described herein can be applied not only to a single DUT, but they can also be applied concurrently to independent portions of a DUT and also concurrently to a number of DUTs (and to the independent portions of each of those DUTs).

Figure 3:
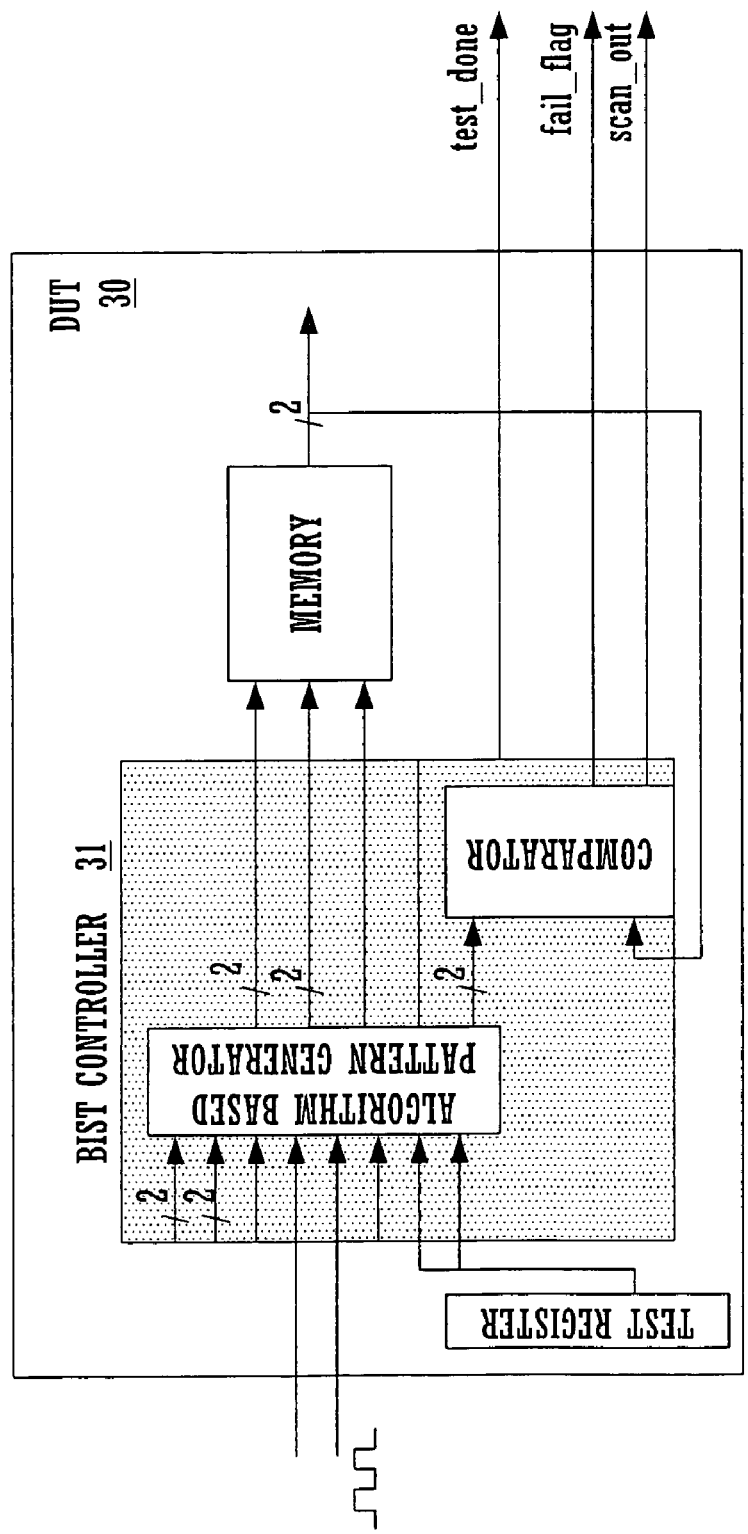
FIG. 3 is a block diagram of an example of a built-in self-test (BIST) controller in a DUT that uses one type of signal protocol in accordance with an embodiment of the present invention.

FIG. 3 is a block diagram of an example of a BIST controller 31 in a DUT 30 that uses one type of signal protocol in accordance with an embodiment of the present invention. In the example of FIG. 3, three signals are sent from the DUT 30 to the test instrument 10 (FIGS. 1 and 2): test_done, fail_flag, and scan_out. Test_done is asserted only when BIST controller 31 is finished testing. When test_done is active, fail_flag indicates whether the test passed or failed. In addition, fail_flag is used to identify whether there is valid debugging information in the scan_out signals.

Figure 4:
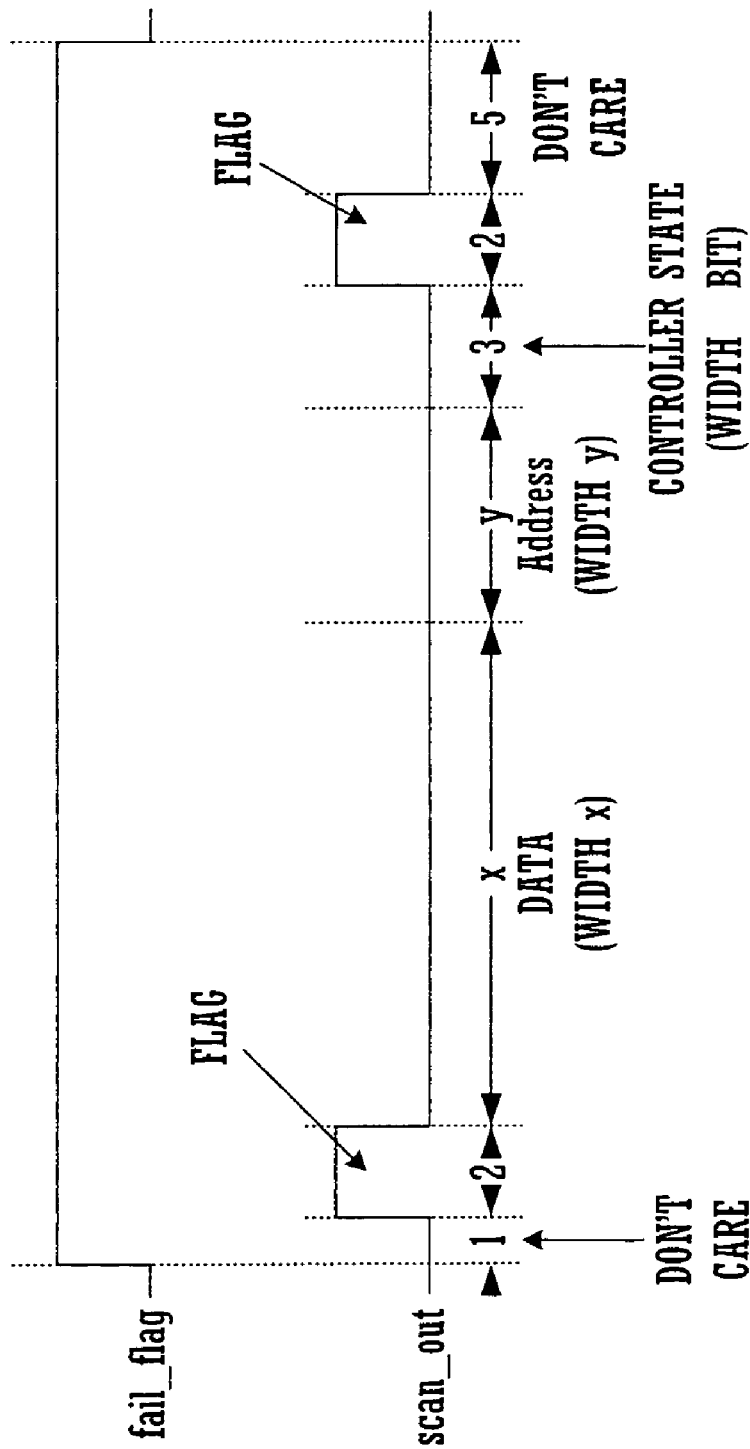
FIG. 4 illustrates examples of signals produced according to the protocol of FIG. 3 in accordance with one embodiment of the present invention.

For each faulty address/data pair, a frame consisting of a start sequence (start flag), the failing (faulty) data, the address that is paired with the failing data, and an end flag is sent in the scan_out signals, as illustrated in FIG. 4.

Figure 5:
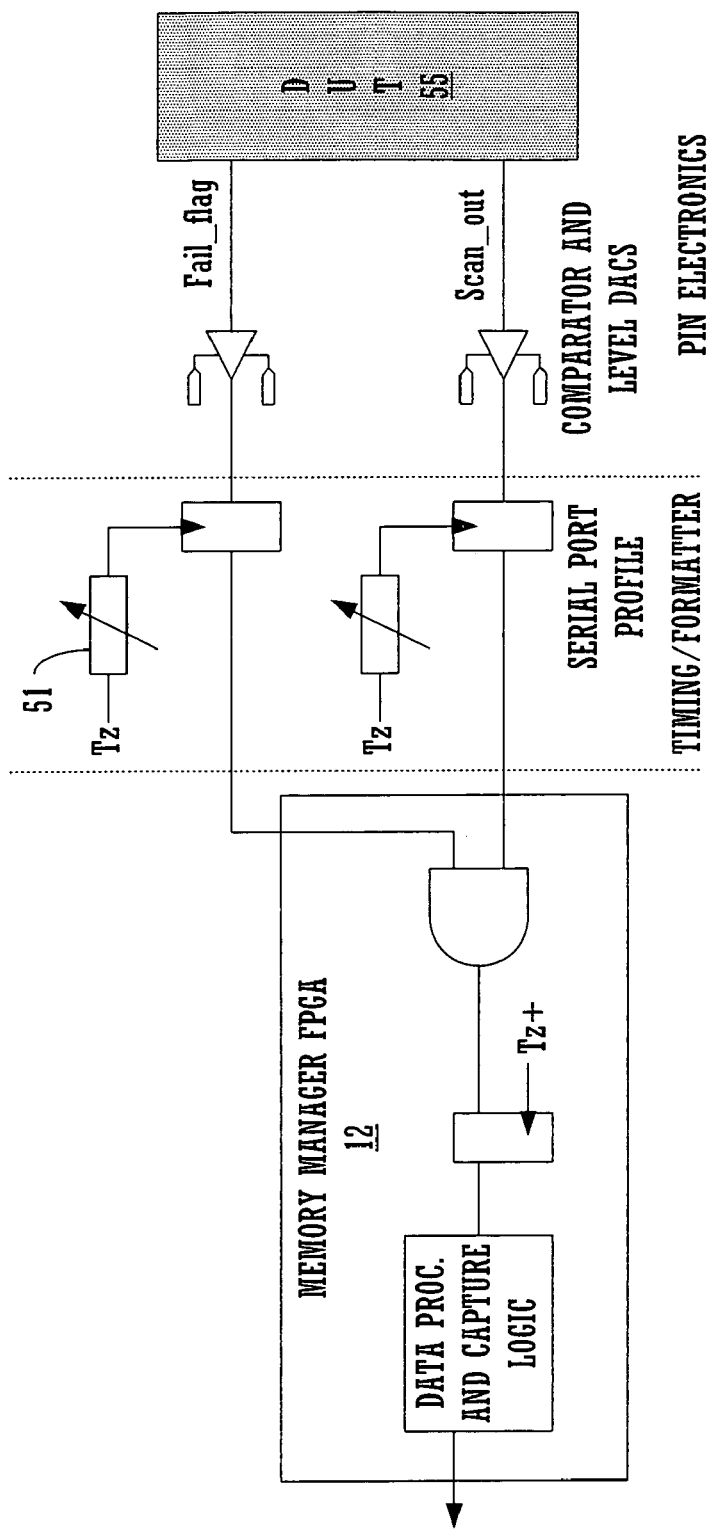
FIG. 5 is a block diagram of a test instrument configured to handle the protocol of FIG. 3 in accordance with one embodiment of the present invention.

FIG. 5 is a block diagram of a test instrument 50 configured to handle the protocol of FIG. 3 in accordance with one embodiment of the present invention. In general, according to the present embodiment, the memory manager FPGA 12 is configured so that a selected tester pin is allowed to conditionally capture and store data based on the state of another pin. Specifically, the fail_flag signal on one pin is used as a gating condition for the scan_out pin, so that the latter pin will only capture data when the fail_flag signal is asserted. In the present embodiment, the fail_flag pin is set up to be sampled by its timing data generator 51, with a "test for zero" event each bit time. The result of the test for zero is then used to enable data capture on the scan_out pin. As long as the fail_flag pin is sampled as true, data on the scan_out pin can be captured into memory. The test_done pin is also monitored to determine when the test is completed.

Although the example described above, and the other examples discussed herein, are generally described using one pin for output data, it is understood that there can be more than one output data pin, and that the fail_flag pin (or like pins) can be used to conditionally control each of those output data pins. In some instances, multiple output data pins are used in parallel because that is less time consuming than serially shifting data through a single pin.

Multiple, concurrently operating BIST controllers on DUT 55 can be readily handled. Each BIST controller will have its own fail_flag and scan_out pins to control the capture of data. A synchronizing signal can be generated to signify when all of the test_done pins are asserted (e.g., true).

The amount of memory that would be required for data storage can be allocated from the memory pool (the "sea of memory" mentioned above). Because data is being conditionally captured, memory is not unnecessarily consumed, and furthermore any post-processing of captured data would be reduced.

Figure 6:
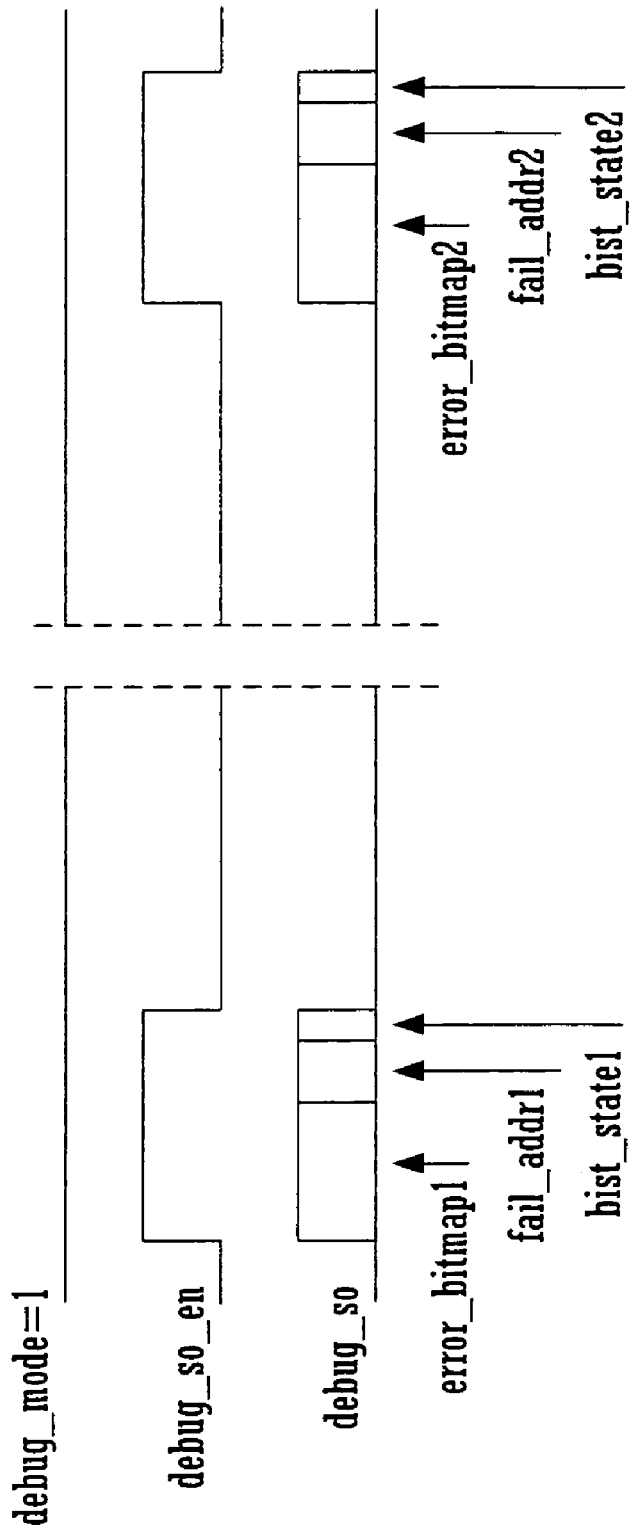
FIG. 6 illustrates examples of signals produced according to a second type of signal protocol in accordance with an embodiment of the present invention.

FIG. 6 illustrates examples of signals produced according to a second type of signal protocol in accordance with an embodiment of the present invention. In comparison to FIG. 4, there are no start and end flags. Also, instead of the failing memory content, the failing bits are transmitted. In addition, instead of a fail flag, there is an additional signal (debug_so_en) that indicates when data is streamed out on debug_so ("so" refers to scan out, and "en" to enable).

Figure 7:
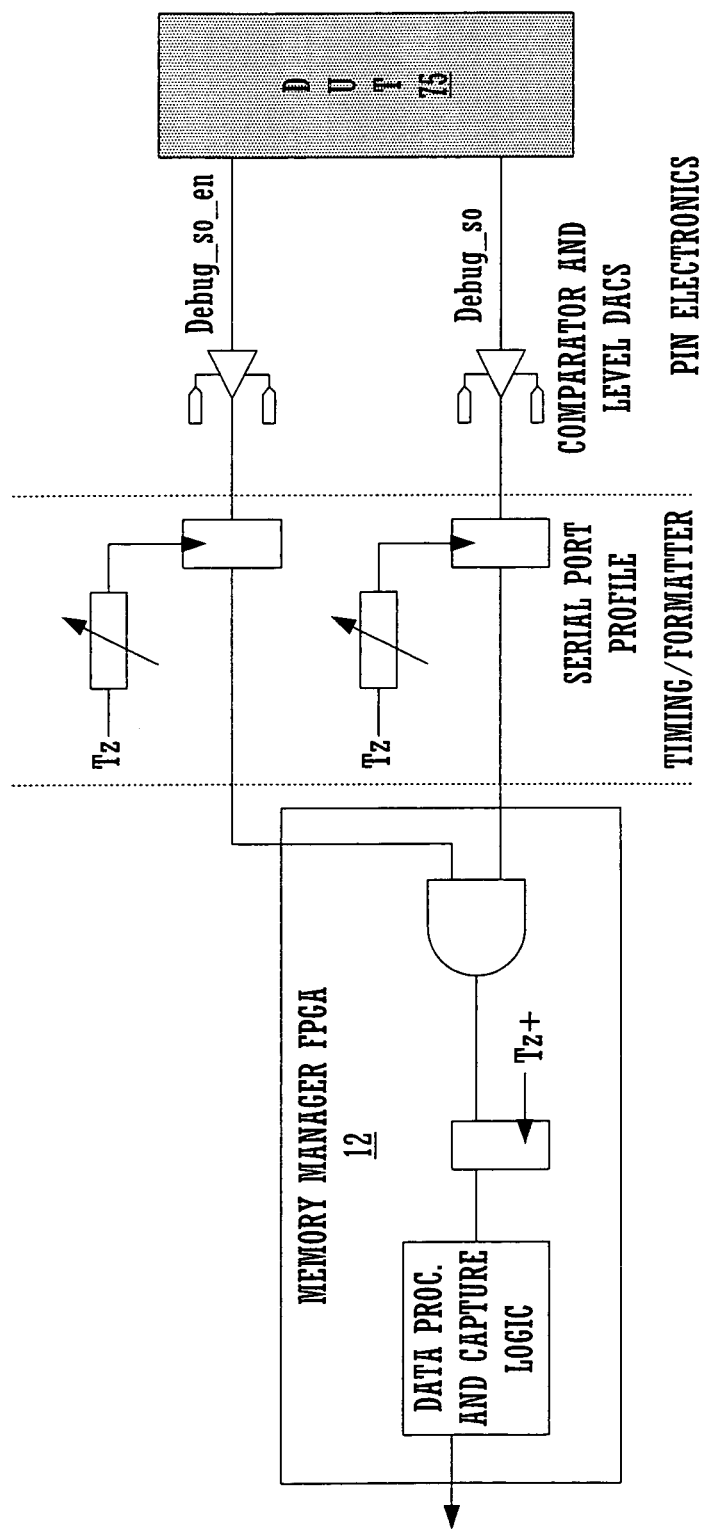
FIG. 7 is a block diagram of a test instrument configured to handle the protocol of FIG. 6 in accordance with one embodiment of the present invention.

FIG. 7 is a block diagram of a test instrument 70 configured to handle the protocol of FIG. 6 in accordance with one embodiment of the present invention. In the present embodiment, memory manager FPGA 12 is configured so that the debug_so_en signal from DUT 75 is used, in a manner similar to the fail_flag signal of FIG. 5, to enable data capture of the data streaming on the debug_so pin. For each bit time in which debug_so_en is true, the data sampled on debug_so is captured into memory. Thus, in general, the memory manager FPGA 12 is configured so that a selected tester pin is allowed to conditionally capture and store data based on the state of another pin.

Figure 8:
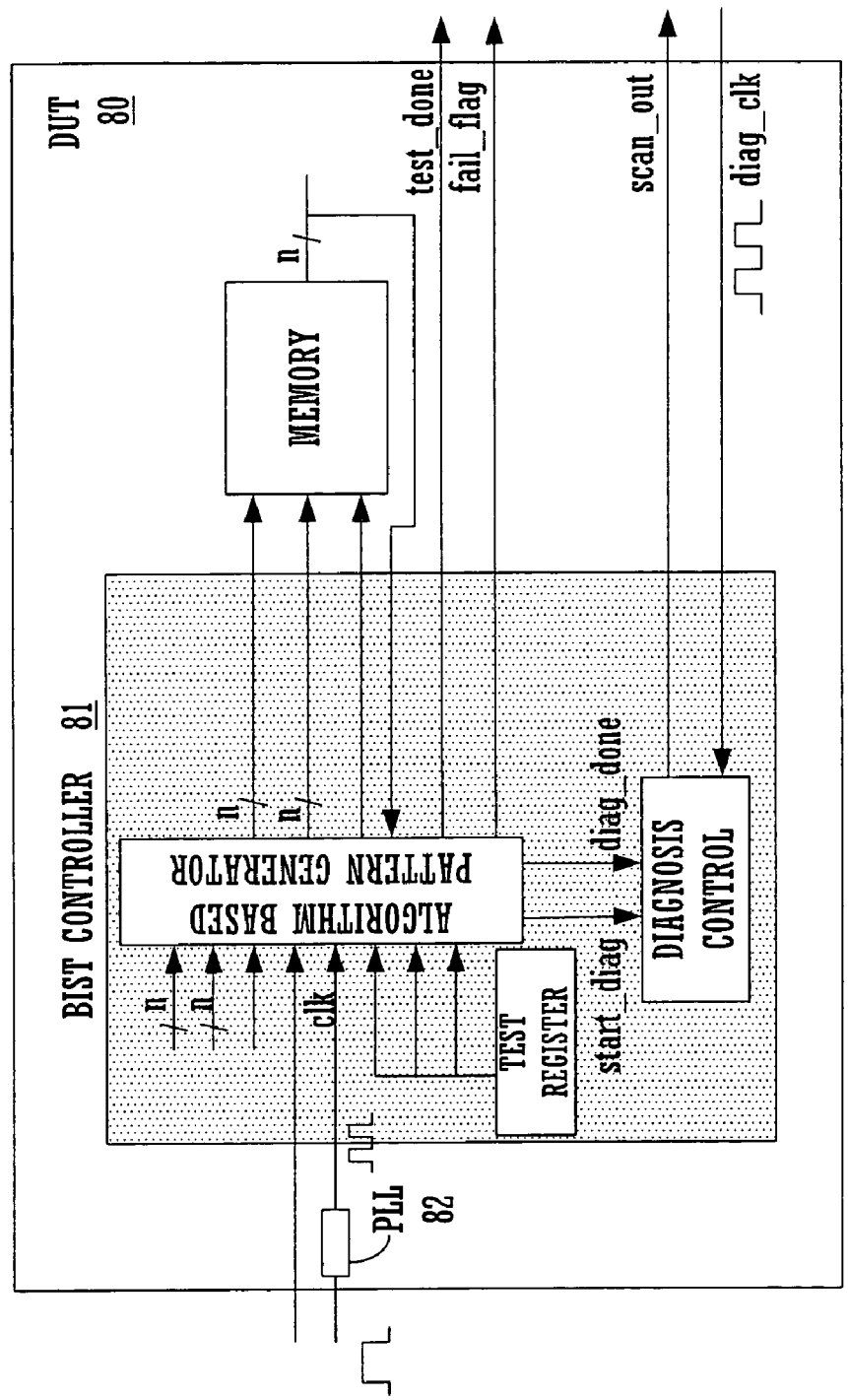
FIG. 8 is a block diagram of an example of a BIST controller in a DUT that uses a third type of signal protocol in accordance with an embodiment of the present invention.

FIG. 8 is a block diagram of an example of a BIST controller 81 in a DUT 80 that uses a third type of signal protocol in accordance with an embodiment of the present invention. In the present embodiment, an internally-generated phase locked loop (PLL) clock 82 is used to run the test pattern. For diagnosis, the test device can clock out the data. In the embodiment of FIG. 8, there are two modes: in one mode, diag_clk runs continuously; in the second mode, diag_clk runs only when a failure needs to be read out of the DUT 80.

Figure 9:
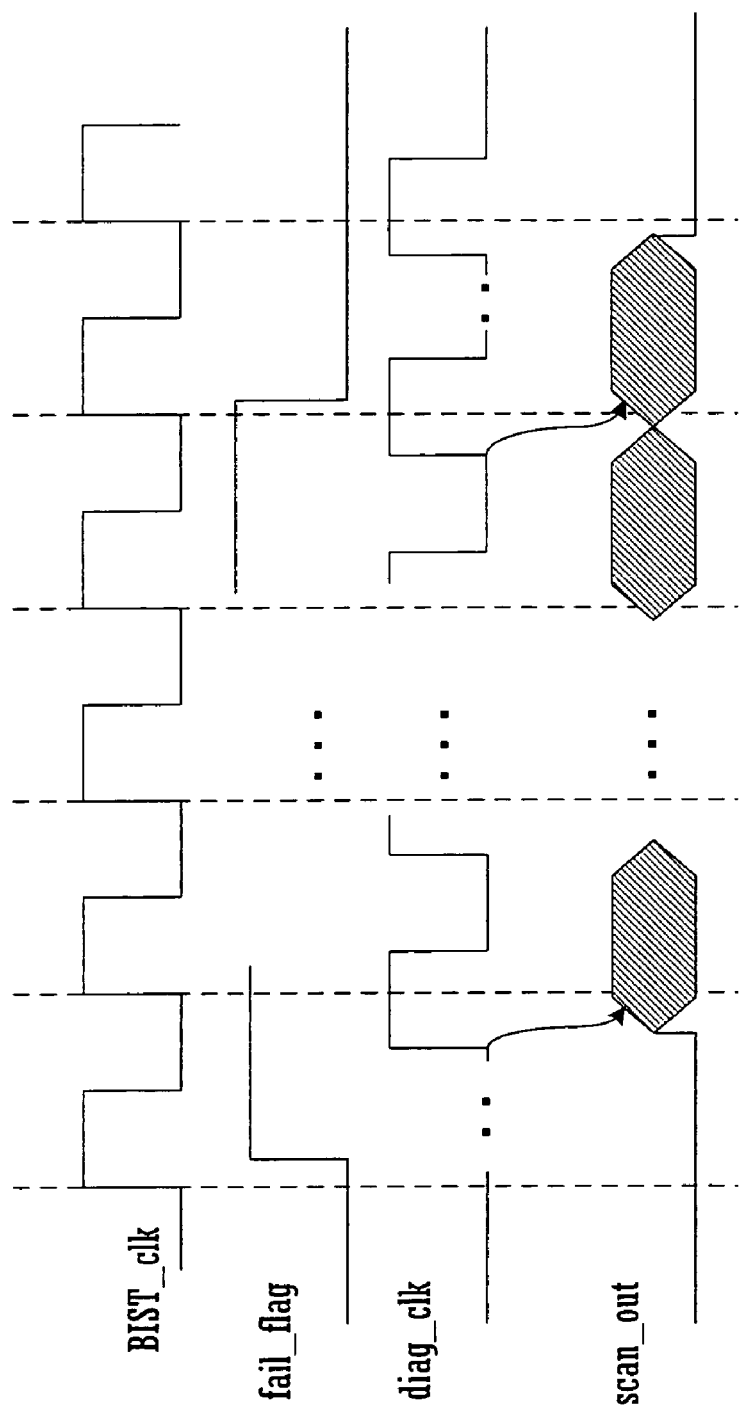
FIG. 9 illustrates examples of signals produced according to the protocol of FIG. 8 in accordance with an embodiment of the present invention.

FIG. 9 illustrates examples of signals produced according to the protocol of FIG. 8 in accordance with an embodiment of the present invention. FIG. 9 shows waveforms of the signals in the first mode, in which diag_clk is running continuously.

For the first mode (in which diag_clk runs continuously), the memory manager FPGA is configured so that a selected tester pin is allowed to conditionally capture and store data based on the state of another pin, in a manner similar to that described above in conjunction with FIGS. 5 and 7. However, an additional test pin is required (e.g., for the diag_clk signal). With regard to the protocol of FIG. 8, the fail_flag pin is sampled each bit time and is used as a gating condition to enable capture and storage of data arriving on the scan_out pin. In the present embodiment, bit time is coherent with diag_clk.

The second mode (in which diag_clk runs only when a failure needs to be read out of the DUT 80) involves the buffering of a failure record in memory internal to DUT 80 prior to eventual scan out of data on the scan_out pin. Thus, the second mode can be handled in the manner of the first mode when data is to be read out of the DUT 80.

Figure 10:
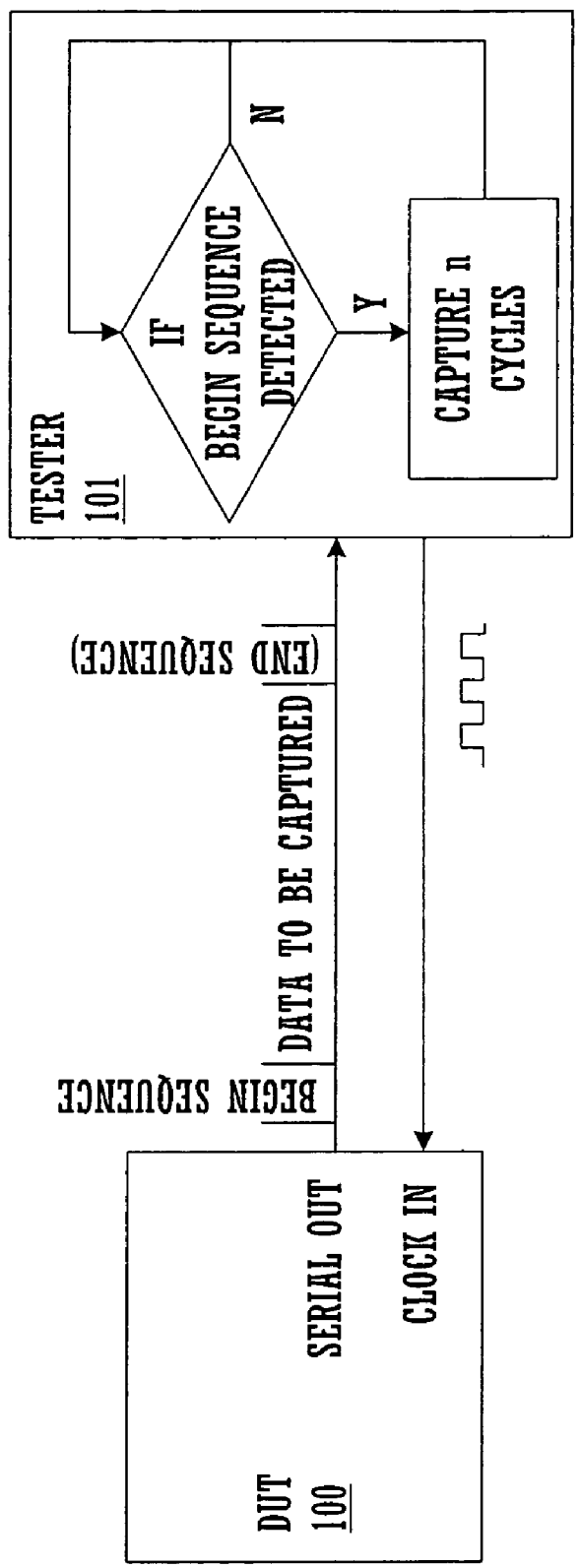
FIG. 10 is a block diagram of an example of a DUT that uses a fourth type of signal protocol in accordance with an embodiment of the present invention.

FIG. 10 is a block diagram of an example of a DUT 100 that uses a fourth type of signal protocol in accordance with an embodiment of the present invention. In the present embodiment, the data output from DUT is synchronous to the test instrument 101. For instance, the clock_in signal coming from the test instrument 101 runs continuously and can be used as a PLL input clock. The DUT 100 will start to stream out data immediately upon the BIST or DFT controller (not shown) indicating a failure. According to the protocol, the anomalous data is indicated by a begin sequence of one or more bits (the length of the begin sequence is known in advance). An end sequence can be optionally used to indicate the end of the anomalous data. Testing begins again after the data is transferred to the test instrument 101.

Figure 11:
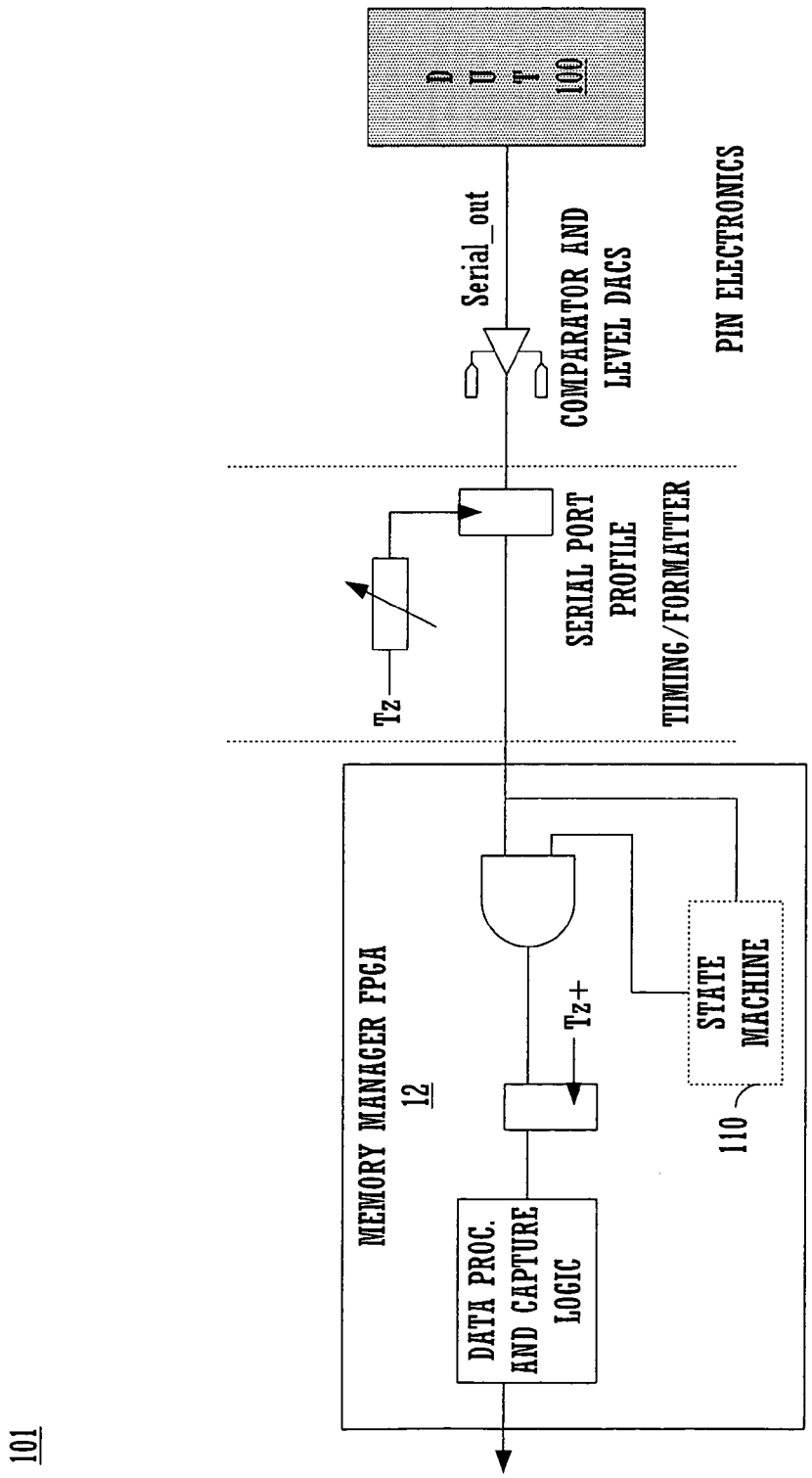
FIG. 11 is a block diagram of a test instrument that implements a state machine to handle the protocol of FIG. 10 in accordance with one embodiment of the present invention.

Again, the memory manager FPGA 12 is configured according to the protocol being used, although in a manner that is different from those described above. FIG. 11 is a block diagram of a test instrument configured to handle the protocol of FIG. 10 in accordance with one embodiment of the present invention. In the present embodiment, memory manager FPGA implements a state machine 110 to recognize the begin sequence in the data streamed from DUT 100.

Figure 12:
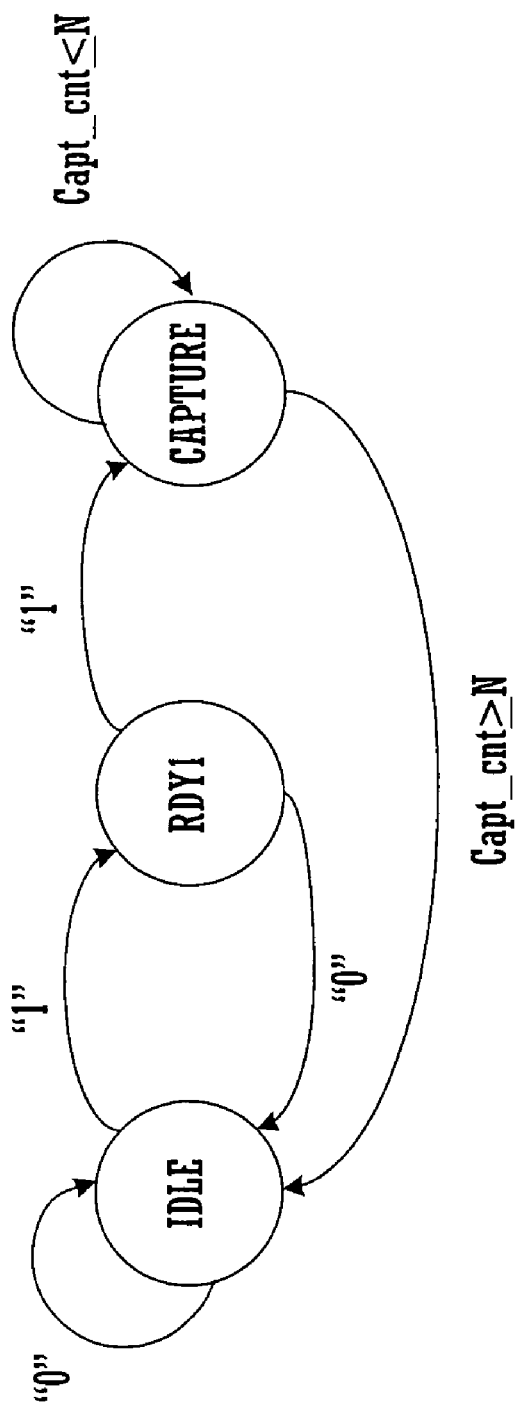
FIG. 12 is a state diagram of the state machine of FIG. 11 in accordance with one embodiment of the present invention.

FIG. 12 illustrates a state machine 110 implemented by the memory manager FPGA 12 to recognize the begin sequence and enable data capture once the begin sequence is detected. Data is captured for a prescribed number (N) of bit times. The sampling of data is at the same frequency as the clock_in pin, but with a programmable phase offset (either a plus or minus delay).

Figure 13:
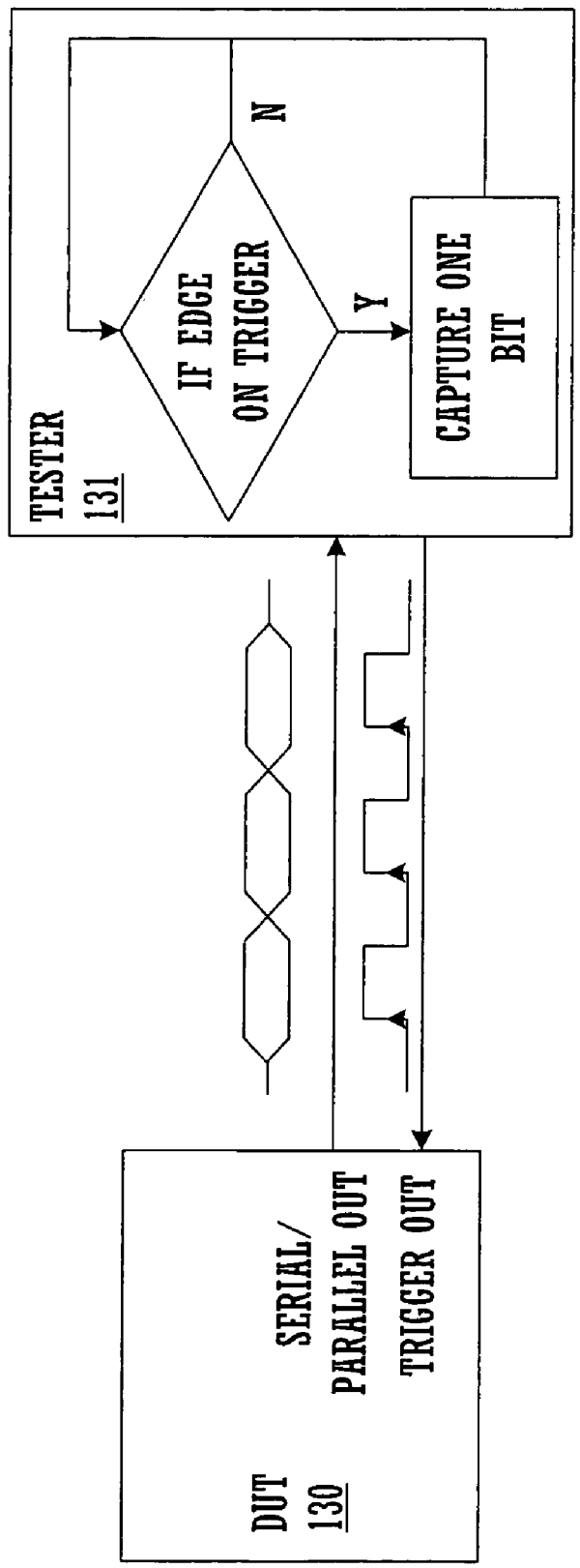
FIG. 13 is a block diagram of an example of a DUT that uses another type of signal protocol in accordance with an embodiment of the present invention.

FIG. 13 is a block diagram of an example of a DUT 130 that uses another type of signal protocol in accordance with an embodiment of the present invention. In the present embodiment, DUT 130 employs a reference clock and so has the capability to run asynchronously relative to the test instrument 131. The reference clock is clocking only when data needs to be captured by the test instrument 131. Test instrument 131 needs to be able to capture data on the edges of the reference clock (e.g., on the edges of trigger_out).

For the protocol of FIG. 13, the memory manager FPGA is configured so that a selected tester pin is allowed to conditionally capture and store data based on the state of another pin. In the present embodiment, the trigger_out signal is used as a gating condition for capturing the data present on the serial/parallel_out pin at sampling time. That is, when trigger_out is asserted, then data on the serial/parallel_out pin is captured and stored.

Figure 14:
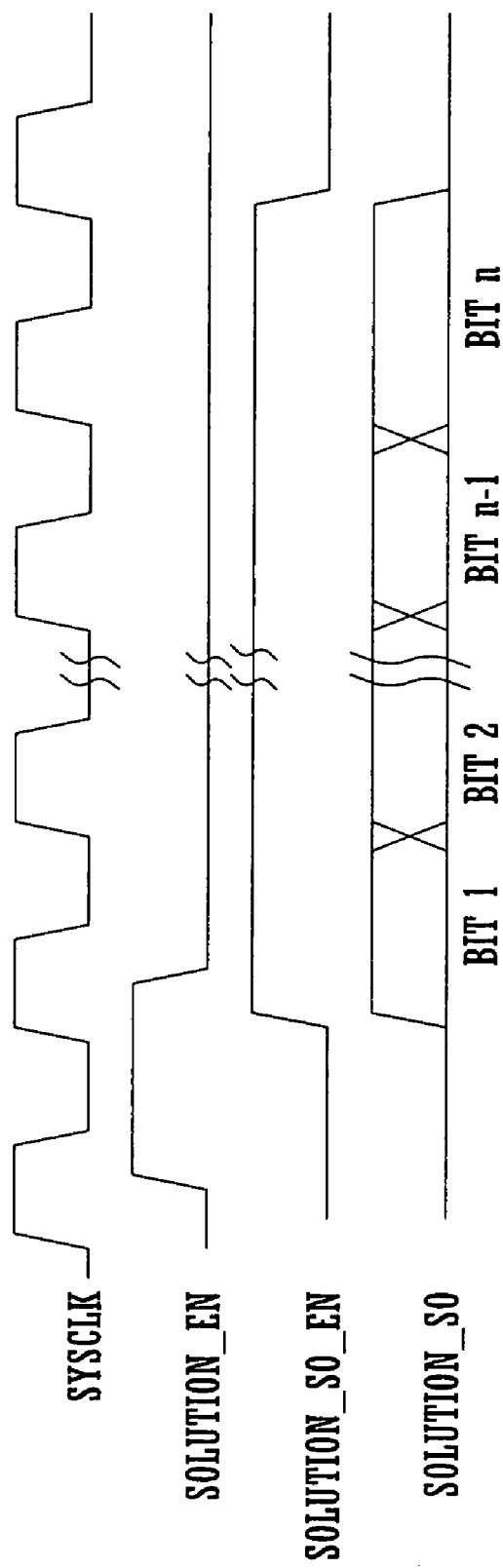
FIG. 14 illustrates examples of signals produced according to yet another signal protocol that can be used by a DUT in accordance with an embodiment of the present invention.

FIG. 14 illustrates examples of signals produced according to yet another signal protocol that can be used by a DUT in accordance with an embodiment of the present invention. The protocol of FIG. 14 pertains to repair information that is to be read by the test instrument after BIST execution on the DUT. The repair information is a serial data stream on the pin solution_so, while the pin solution_so_en indicates the presence of valid data on the solution_so pin. Streaming of data is started by activating the solution_en pin synchronous to the sysclk pin.

Accordingly, the memory manager FPGA is configured so that a selected tester pin is allowed to conditionally capture and store data based on the state of another pin. In this case, the solution_so_en pin is used as the gating condition for the solution_so pin. Both of these pins can be sampled by the test instrument's timing/formatters with a strobe that is set to the middle of the bit time as determined by sysclk. The data capture and storage process begins when solution_en is asserted and captured as long as solution_so_en is also asserted.

Figure 15:
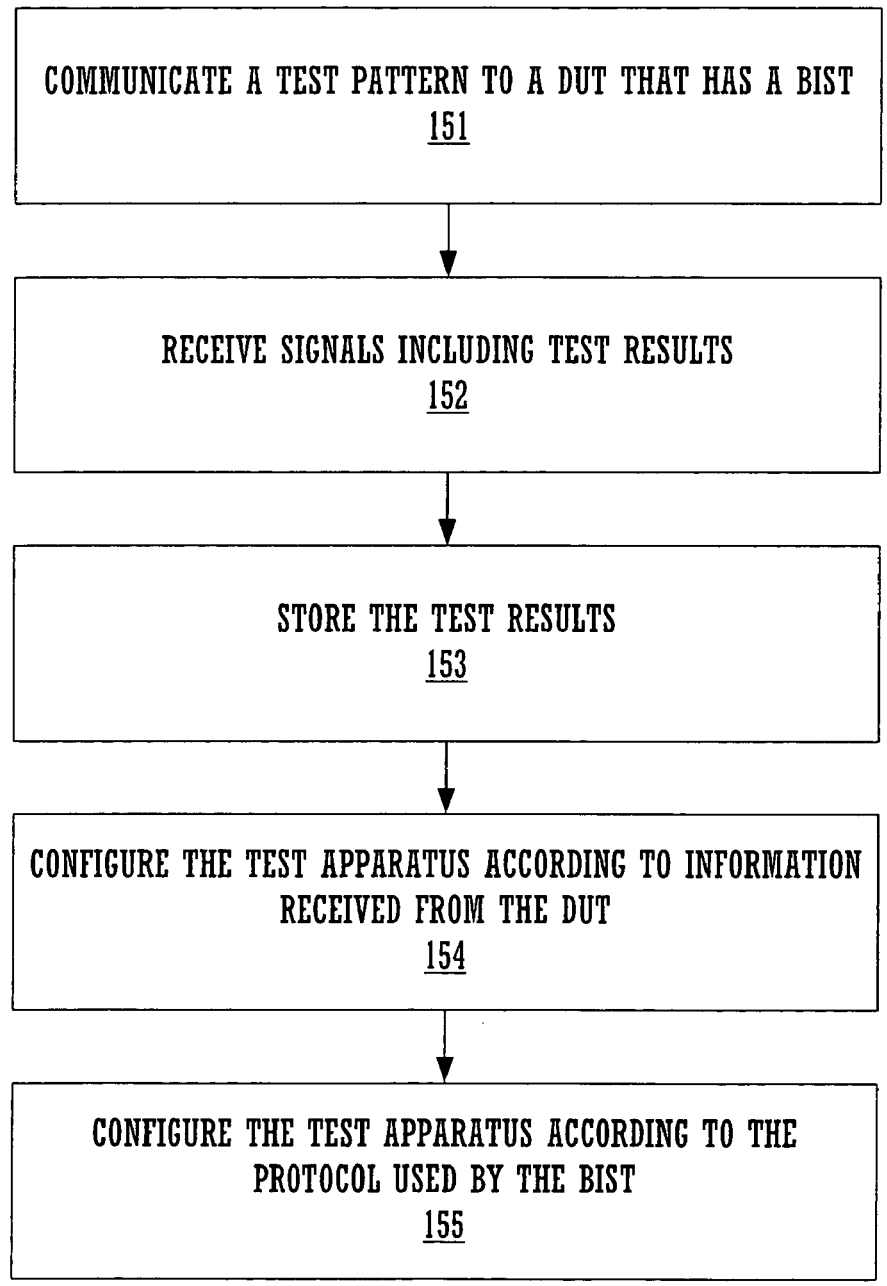
FIG. 15 is a flowchart of a method for configuring a test instrument according to information received from a DUT in accordance with one embodiment of the present invention.

FIG. 15 is a flowchart 150 of a method for configuring a test instrument according to information received from a DUT in accordance with one embodiment of the present invention. Although specific steps are disclosed in flowchart 150, such steps are exemplary. That is, embodiments in accordance with the invention are well suited to performing various other steps or variations of the steps recited in flowchart 150. It is appreciated that the steps in flowchart 150 may be performed in an order different than presented, and that not all of the steps in flowchart 150 may be performed.

In step 151, a test pattern is communicated to a DUT via a plurality of first pins. In one embodiment, the DUT includes a BIST engine.

In step 152, signals that include test results are received from the BIST engine via a plurality of second pins, at least one of the signals including test results.

In step 153, the test results are stored in a memory coupled to the second pins.

In step 154, the test apparatus is configured according to information received from the DUT.

In one embodiment, in step 155, the test apparatus is configured according to a protocol used by the BIST engine, where the protocol establishes what type of information is provided by each of the signals. In one such embodiment, the test apparatus is configured so that test results received on one pin are conditionally captured and stored in response to a signal received on another pin. In another such embodiment, test results are captured and stored once a begin sequence of one or more bits is received from the DUT.

Figure 16:
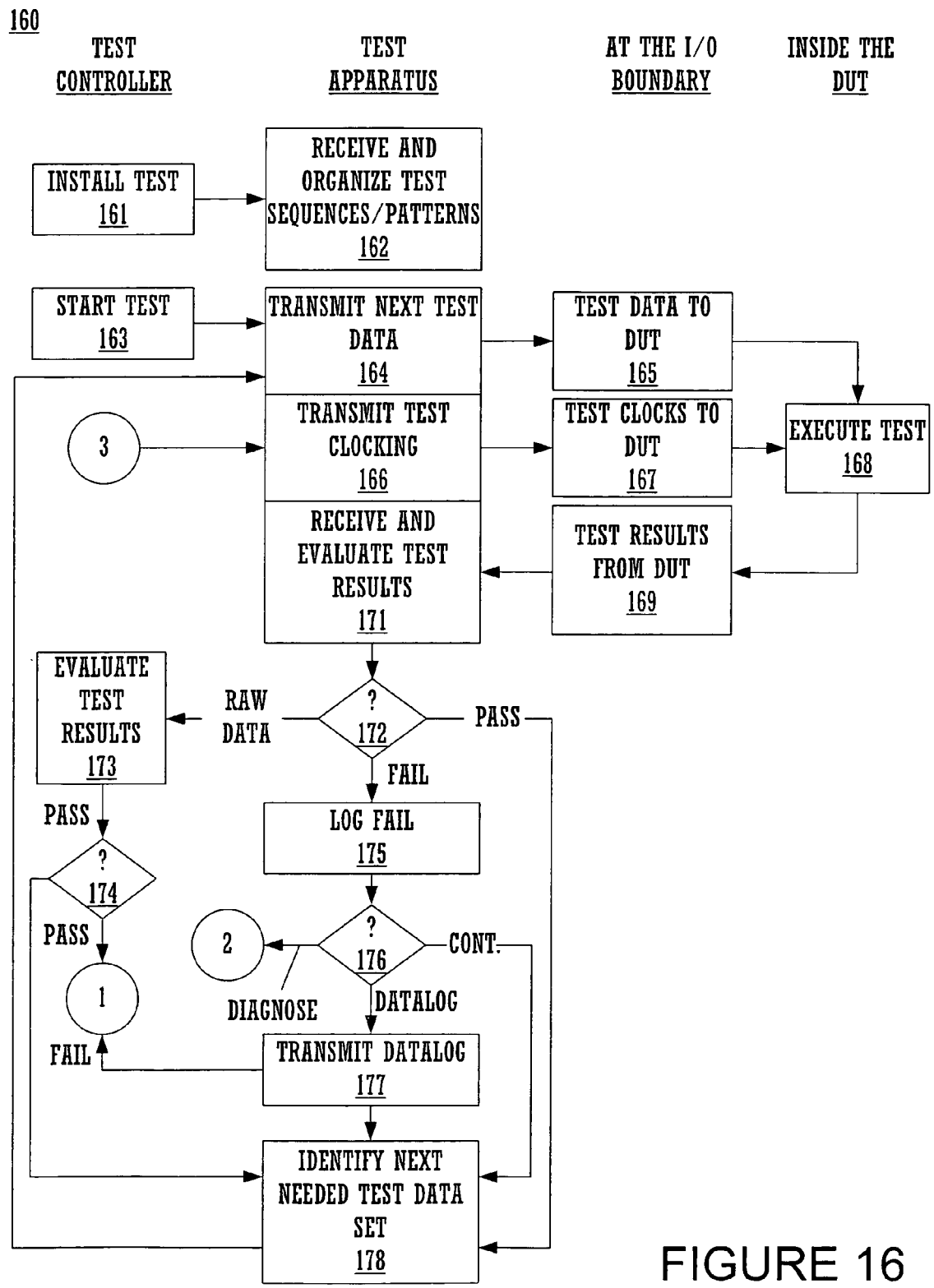
FIG. 16 is a flowchart of a test process in accordance with one embodiment of the present invention.
Figure 17:
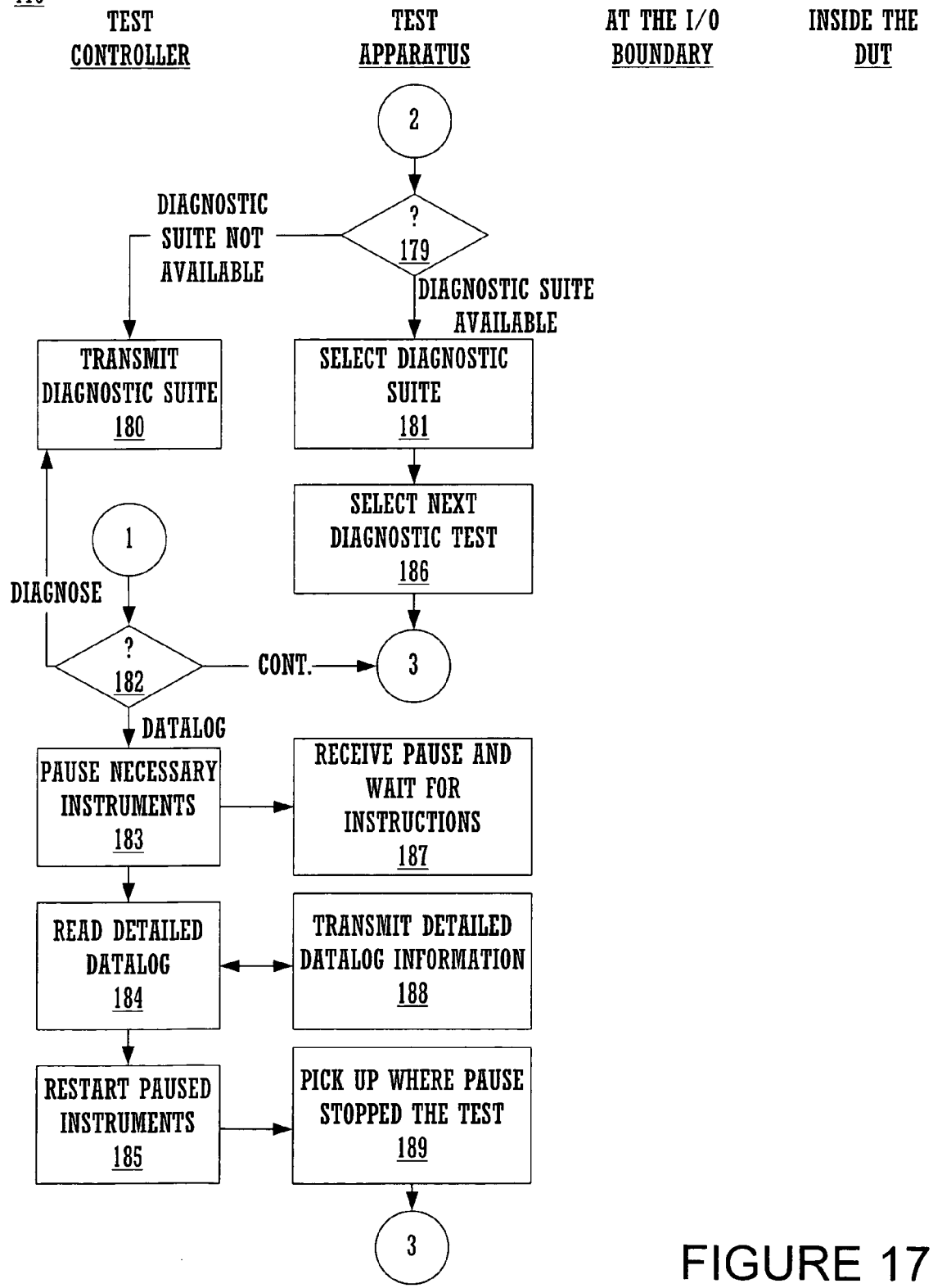
FIG. 17 is a continuation of the flowchart of FIG. 16 according to one embodiment of the present invention.

FIG. 16 is a flowchart 160 of a test process in accordance with one embodiment of the present invention. FIG. 17 is a flowchart 170 that is a continuation of the flowchart 160 of FIG. 16 according to one embodiment of the present invention. Although specific steps are disclosed in flowcharts 160 and 170, such steps are exemplary. That is, embodiments in accordance with the invention are well suited to performing various other steps or variations of the steps recited in flowcharts 160 and 170. It is appreciated that the steps in flowcharts 160 and 170 may be performed in an order different than presented, and that not all of the steps in flowcharts 160 and 170 may be performed.

Both FIGS. 16 and 17 show, for each of the steps in the flowcharts, which functional element in a testing system is implementing the step according to one embodiment of the present invention. In FIGS. 16 and 17, the test controller can correspond to a computer system that is coupled to the test apparatus, and the test apparatus can correspond to the test instrument 10 of FIGS. 1 and 2. Alternatively, the test controller and the test apparatus may be combined into a single device. Each test instrument can simultaneously manage test data for several DUTs. Each test may require simultaneous activity from several test instruments.

Referring first to FIG. 16, in block 161, the test controller installs a test on the test apparatus. In block 162, the test apparatus receives the test and organizes the test into test sequences/patterns. In block 163, the test controller instructs the test apparatus to start the test. In blocks 164 and 165, the test data (e.g., the test sequences/patterns) are transmitted though the I/O boundary to the DUT. In blocks 166 and 167, required test clocking is sent to the DUT. In block 168, the DUT executes the test at hand. In block 169, the test results are sent from the DUT to the test apparatus.

In block 171, the test apparatus receives and evaluates the test results. The test apparatus may be paused at block 172 for the evaluation. The DUT can be kept activated and synchronized with the test apparatus while the evaluation proceeds, if the time needed for the evaluation becomes significant. At block 172, flowchart 160 can proceed to either block 173, block 175 or block 178.

From block 172, raw test data can be sent from the test apparatus to the test controller. In block 173, the test controller asynchronously evaluates the test results. Test controller makes a pass/fail determination in block 174. If the test results indicate that the DUT passed the test, then flowchart 160 proceeds to block 178. Otherwise, flowchart 160 proceeds to block 182 of FIG. 17.

Continuing with reference to FIG. 16, starting again at block 172, the test apparatus makes a pass/fail determination. If the test results indicate a test program failure, then the failure is logged in block 175. From block 176, flowchart 160 proceeds to block 179 of FIG. 17 for the diagnostic process. Also from block 176, if the test results are datalogged, then the datalog is transmitted to the test controller in block 177. If datalogging is not performed in this instance, or if the datalogging is done in parallel, then flowchart 160 continues from block 176 directly to block 178.

In block 178 of FIG. 16, the test apparatus identifies the next test data set (e.g., test sequences/patterns) that is needed. Flowchart 160 then moves from block 178 back to block 164, and the process is repeated for the next set of test data.

Referring now to FIG. 17, picking up from blocks 174 and 177 of FIG. 16, at block 182 the test controller can either make a diagnosis, datalog, or continue without a diagnosis or without datalogging. In the latter instance, flowchart 170 returns to blocks 164 and 166 of FIG. 16. Along the diagnostic path, flowchart 170 proceeds to block 180, where the test controller transmits a diagnostic suite to the test apparatus.

Continuing with reference to FIG. 17, picking up from block 176 of FIG. 16, at block 179 the test apparatus determines whether or not a needed diagnostic suite is available. If not, then the needed diagnostic suite is received from the test controller in block 180. Otherwise, flowchart 170 proceeds to block 181, where the test apparatus makes a selection of a diagnostic suite from those available. From the diagnostic suite, the test apparatus selects a diagnostic test from the selected diagnostic suite, and flowchart 170 proceeds to blocks 164 and 166, where the test data for the diagnostic test and required test clocking are transmitted to the DUT, and flowchart 160 can then proceed from that point as described above.

Returning to block 182 of FIG. 17, along the datalog path, the test controller pauses necessary test instruments in block 183. In block 187, the test apparatus receives the pause and waits for instructions from the test controller.

In block 188, the test apparatus can transmit detailed datalog information to the test controller. In block 184, the test controller reads the detailed datalog information. In block 185, the test controller can then restart the instruments that were paused in block 187. In block 189, the test apparatus picks up from where the test was paused.

Significantly, the process described above reduces the overhead for datalogging to about one to four percent of test time. The amount of data that is datalogged can be reduced to, for example, the failing pin(s) and the test cycle count. The failing pin is used identify the scan out path. The test cycle count is used to identify the failing flop using a precomputed correlation between test count and the start of each scan pattern (for each scan chain). Multiple failing scan vectors, pointing to the same area of failure, can be collected and used to suggest or identify the location of a defect in the DUT. The nature of the defect is suggested by the fail pattern. The relationship between the location and the nature of the defect can be extracted using a synthesis tool. New tests can also be generated to get additional datalogs to help pinpoint the defect.

Also, another important aspect of the process described by FIGS. 16 and 17 is that, based on an evaluation of the test results, either the test controller or the test apparatus can implement the diagnostic process. In one exemplary test flow, at block 172, raw test result data is passed to the test controller, which can evaluate the test results (block 173). If a test program failure is indicated (block 174), then the test controller can provide a diagnostic suite to the test apparatus (blocks 182 and 180). The test apparatus can then select a diagnostic suite and a diagnostic test from the selected diagnostic suite (blocks 181 and 186). The selected diagnostic test can then be executed on the DUT.

In another exemplary test flow, the test apparatus evaluates the test results (block 171). If a test program failure is indicated (block 172), then the failure can be logged (block 175), and then the test apparatus can implement the diagnostic process (block 176). If the required diagnostic suite is not available at the test apparatus (block 179), it is received from the test controller (block 180). Test apparatus can then select a diagnostic suite and a diagnostic test from the selected diagnostic suite (blocks 181 and 186). The selected diagnostic test can then be executed on the DUT.

It is not necessary that the entire diagnostic test suite be precomputed. Instead, a substantial portion of the diagnostic test suite can be precomputed, and additional diagnostic tests can be generated on demand. Additional diagnostic tests can be generated relatively quickly using techniques known in the art.

Thus, according to embodiments of the invention, the test apparatus recognizes a test program failure indicating that there may be a defect in the DUT, and changes the test flow accordingly to implement a diagnostic process and diagnostic tests. Precomputed diagnostic tests can be selected and implemented based on an evaluation of the test results, thus saving time.

Moreover, embodiments of the invention allow data (e.g., test results) to be more efficiently collected and evaluated. For example, test results can be conditionally captured and stored by using a flag on one pin to identify a test failure, and collecting test results on another pin only when the flag is set.

Embodiments of the present invention are thus described. While the present invention has been described in particular embodiments, it should be appreciated that the present invention should not be construed as limited by such embodiments, but rather construed according to the below claims.

What is claimed is:

1. In a test apparatus, a method of testing a device, said method comprising:
   sending a first test pattern to a device under test (DUT), said first test pattern part of a planned sequence of tests, wherein a first test is executed using said first test pattern;
   evaluating test results for said first test and received from said DUT, said test results comprising anomalous data indicative of a defect in said DUT;
   automatically selecting a second test pattern that is not part of said planned sequence of tests, wherein said second test pattern is selected based on a diagnosis of said anomalous data by said test apparatus, wherein said diagnosis is performed by recognizing a pattern in said anomalous data, wherein said second test pattern is selected according to said pattern in said anomalous data; and
   sending said second test pattern to said DUT, wherein a second test is executed using said second test pattern.

2. The method of claim 1 wherein only said anomalous data is saved and evaluated by said test apparatus.

3. The method of claim 1 wherein said test apparatus comprises a plurality of pins for receiving signals from said DUT, wherein at least one of said signals includes said test results.

4. The method of claim 3 wherein said test results received on said one of said pins are conditionally captured and stored in response to a signal received on another of said pins.

5. The method of claim 3 wherein said test results are conditionally captured and stored in response to said test apparatus recognizing a begin sequence of one or more bits received from said DUT.

6. The method of claim 5 wherein capture and storage of said test results are ended in response to said test apparatus recognizing an end sequence of one or more bits received from said DUT.

7. The method of claim 1 wherein said second test pattern is selected from a plurality of precomputed test patterns.

8. An automated test system comprising:
   a test controller; and
   a test instrument coupled to said test controller, wherein said test instrument sends a first test pattern to a device under test (DUT) that executes a first test using said first test pattern, said first test pattern part of a planned sequence of tests, evaluates test results for said first that are received from said DUT, said test results comprising anomalous data indicative of a defect in said DUT, and automatically selects a second test pattern that is not part of said planned sequence of tests, wherein said second test pattern is selected based on a diagnosis of said anomalous data by said test instrument, wherein said diagnosis is performed by recognizing a pattern in said anomalous data, wherein said second test pattern is selected according to said pattern in said anomalous data, wherein said second test pattern is sent to said DUT, and wherein a second test is executed using said second test pattern.

9. The automated test system of claim 8 wherein only said anomalous data is saved and evaluated by said test instrument.

10. The automated test system of claim 8 wherein said test instrument comprises a plurality of pins for receiving signals from said DUT, wherein at least one of said signals includes said test results.

11. The automated test system of claim 8 wherein said test results received on said one of said pins are conditionally captured and stored in response to a signal received on another of said pins.

12. The automated test system of claim 8 wherein said test results are conditionally captured and stored in response to said test instrument recognizing a begin sequence of one or more bits received from said DUT.

13. The automated test system of claim 12 wherein capture and storage of said test results are ended in response to said test instrument recognizing an end sequence of one or more bits received from said DUT.

14. The automated test system of claim 8 wherein said second test pattern is selected from a plurality of precomputed test patterns.

15. An automated test system comprising:
  means for sending a first test pattern to a device under test (DUT), said first test pattern part of a planned sequence of tests, wherein a first test is executed using said first test pattern;
  means for evaluating test results for said first test that are received from said DUT, said test results comprising anomalous data indicative of a defect in said DUT; and
  means for automatically selecting a second test pattern that is not part of said planned sequence of tests, wherein said second test pattern is selected based on a diagnosis of said anomalous data by said test apparatus, wherein said diagnosis is performed by recognizing a pattern in said anomalous data, wherein said second test pattern is selected according to said pattern in said anomalous data, wherein said means for sending then sends said second test pattern to said DUT, and wherein a second test is executed using said second test pattern.

16. The automated test system of claim 15 wherein only said anomalous data is saved and evaluated.

17. The automated test system of claim 15 wherein said test results are conditionally captured and stored in response to a signal received from said DUT.

18. The automated test system of claim 15 wherein said test results are conditionally captured and stored in response to a begin sequence of one or more bits received from said DUT.

19. The automated test system of claim 18 wherein capture and storage of said test results are ended in response to an end sequence of one or more bits received from said DUT.

20. The automated test system of claim 15 wherein said second test pattern is selected from a plurality of precomputed test patterns.

* * * * *